United States Patent [19]
Johannessen

[11] 3,711,725
[45] Jan. 16, 1973

[54] APPARATUS AND METHOD FOR RADIO-FREQUENCY PULSE GENERATION IN TUNED RADIO-FREQUENCY LOADS

[75] Inventor: Paul R. Johannessen, Lexington, Mass.

[73] Assignee: Megapulse Incorporated, Waltham, Mass.

[22] Filed: Aug. 23, 1971

[21] Appl. No.: 173,827

[52] U.S. Cl. ....................307/108, 307/107, 331/167
[51] Int. Cl. ....................H03k 3/02
[58] Field of Search...307/106, 107, 108; 331/117 R, 331/167; 343/100

[56] References Cited

UNITED STATES PATENTS

| | | | |
|---|---|---|---|
| 3,435,431 | 3/1969 | Heckler et al. | 307/106 X |
| 3,611,210 | 10/1971 | Theodore | 307/106 X |
| 3,611,211 | 10/1971 | Theodore | 307/106 X |

*Primary Examiner*—Robert K. Schaefer
*Assistant Examiner*—William J. Smith
*Attorney*—David Rines et al.

[57] ABSTRACT

This disclosure describes a radio frequency (RF) pulse generation system employing magnetic pulse compression circuits coupled through individual matching transformers into a tuned RF load. The pulse compression circuits are operated sequentially, and each circuit is matched to the tuned load the impedance of which (volt-ampere relation) is a function of the current amplitude during the generation of fast rising pulses. Variations in amplitude, pulse width and position of each half-cycle current pulse are obtained by control of the corresponding magnetic pulse compression circuit.

10 Claims, 12 Drawing Figures

APPARATUS AND METHOD FOR RADIO-FREQUENCY PULSE GENERATION IN TUNED RADIO-FREQUENCY LOADS

The present invention relates to apparatus for and methods of RF pulse generation, being specifically concerned, in one aspect, with high-power transmitting systems of the RF pulse type coupled to high Q antenna systems.

Of particular interest, in connection with the invention, are pulse sequential RF generating circuits of the types described in U.S. Pat. No. 2,786,132, issued Mar. 19, 1957, to Robert H. Rines and No. 3,243,728, issued Mar. 29, 1966, to G. R. Brainerd et al. Novel use of such sequential inverter techniques with magnetic pulse compression circuits is described in my copending application, Magnetic Pulse Compression Radio-Frequency Generator Apparatus and Method, filed on or about Aug. 11, 1971, wherein energy storage and discharge circuits are provided at a plurality of locations for sequential operation, with each such circuit connected under the control of SCR trigger devices or the like with a corresponding magnetic pulse compression network, and with all such networks connected to a common load.

The generation of fast-rising RF pulses in a high Q antenna is a principal application of the present invention, requiring a very high volt-ampere rating of the RF power source. In conventional RF pulse generation systems using high power vacuum tubes or solid state power amplifiers to provide the RF power and to shape the envelope of the RF pulse, the vacuum tube or solid state components must, unfortunately, have a volt-ampere rating of an order of magnitude greater than the pulse power delivered to the antenna radiation resistance. In accordance with the invention, through novel use of the above-mentioned solid-state SCR or similar-controlled magnetic compression networks in sequential inverter circuits, however, it has been found that the volt-ampere rating of the solid state devices may significantly be reduced by the pulse compression ratio.

It is, therefore, an object of the invention to provide a new and improved apparatus for and method of high-power, wide-bandwidth RF pulse generation in a narrow band-width or tuned load with the aid of solid state devices rated far below the volt-ampere rating required of the tuned load.

Another object is to provide a novel radio-frequency pulse generation apparatus and method of more general utility, as well.

Other and further objects will be hereinafter explained and more particularly delineated in the appended claims.

In summary, the invention employs sequentially operated pulse compression circuits of the character described having each circuit matched to the tuned load, the impedance of which (volt-ampere relation) is a function of the current amplitude during the generation of fast rising pulses, with control therein of variations in amplitude, pulse width and position of each half-cycle current pulse produced thereby.

Figure 1:
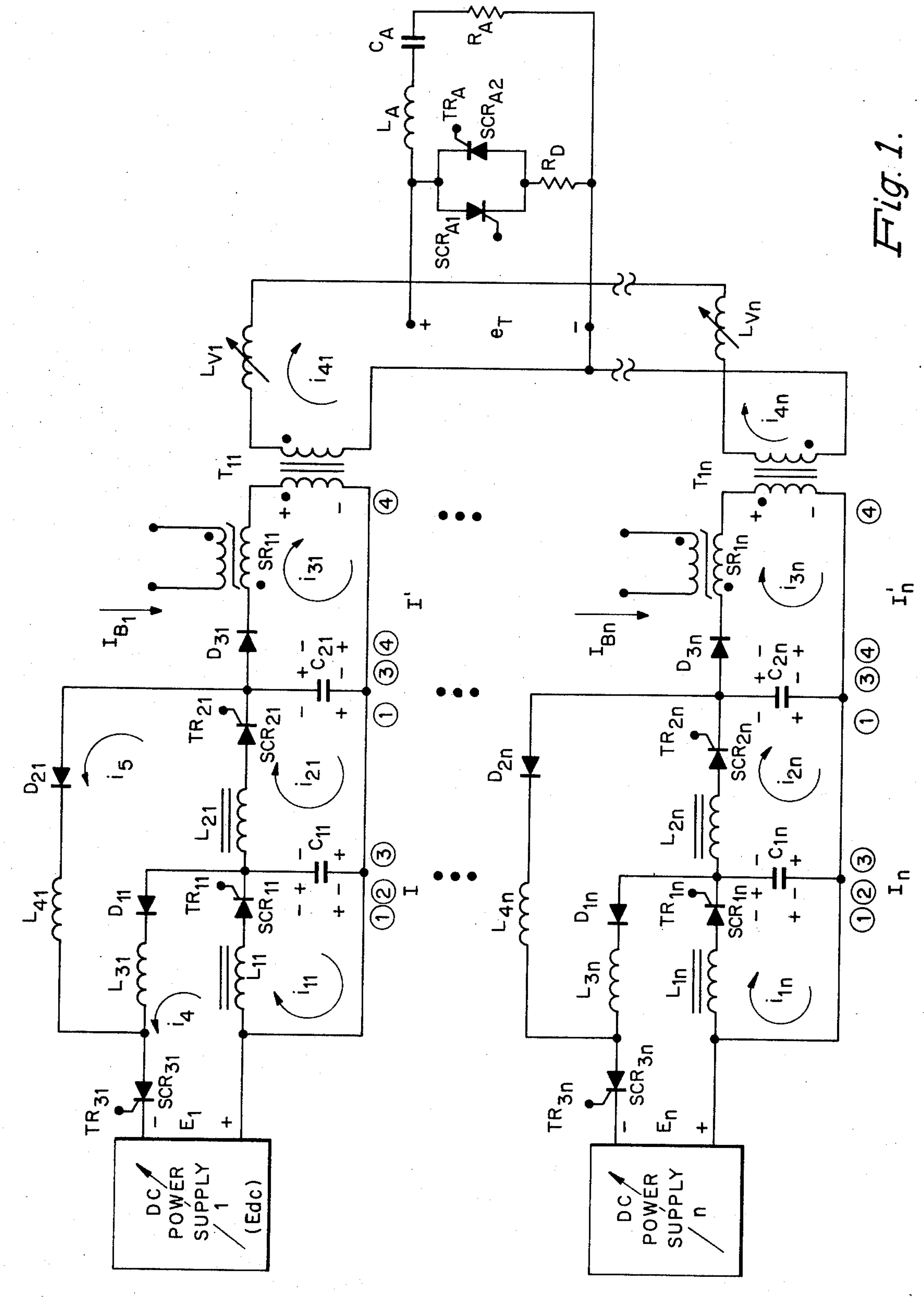
Figure 2A:
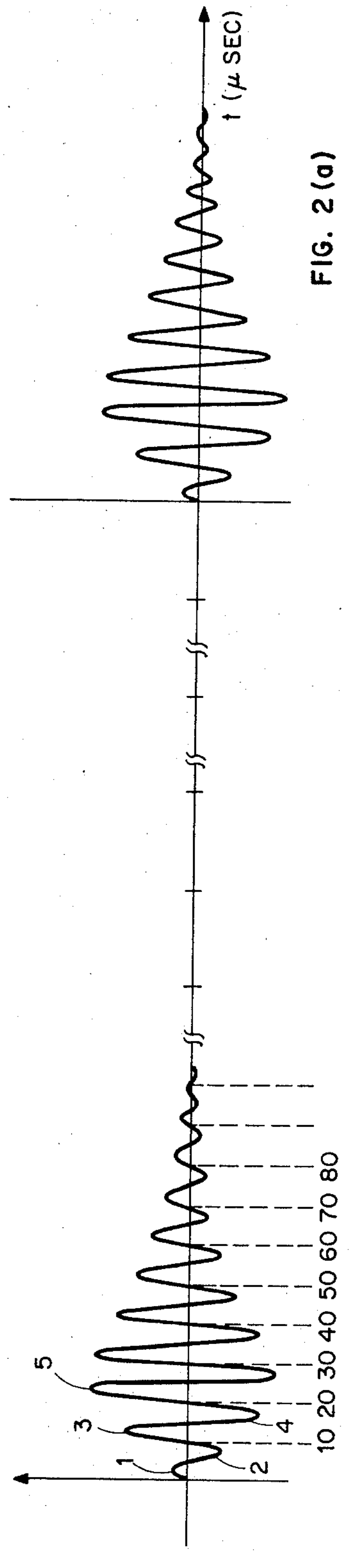
Figure 2B:
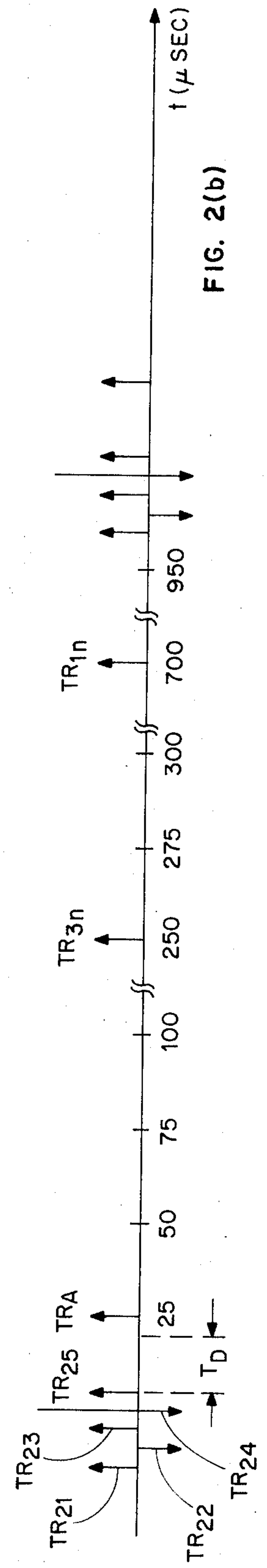
Figure 3A:
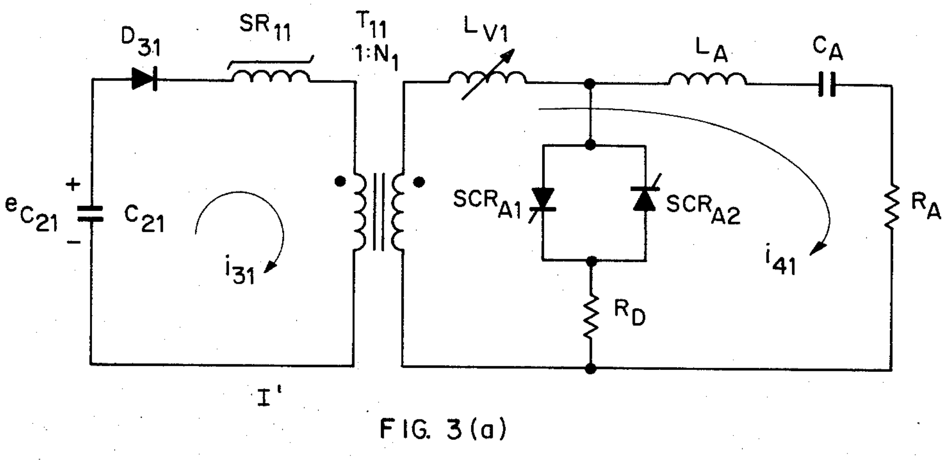
Figure 3B:
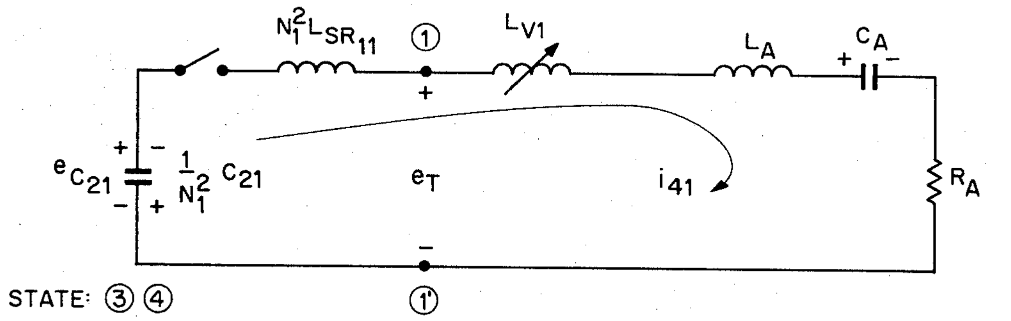
Figure 3:
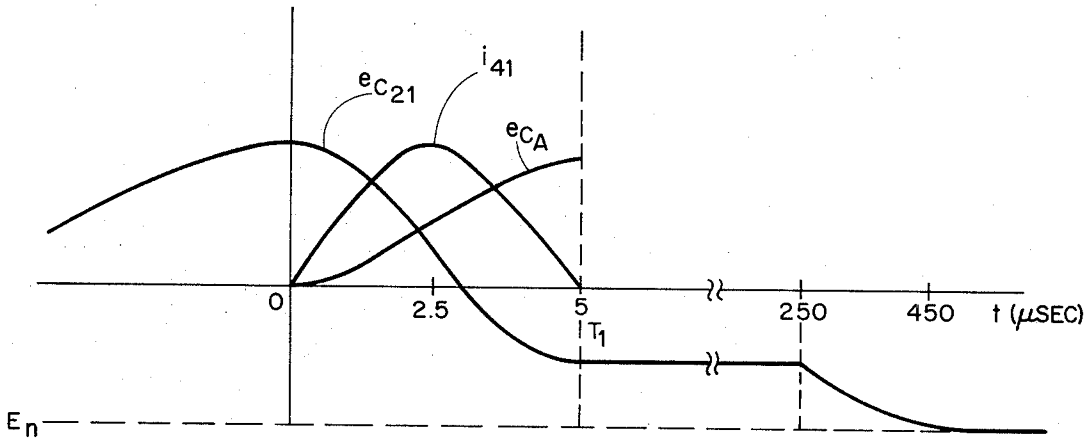
Figure 4:
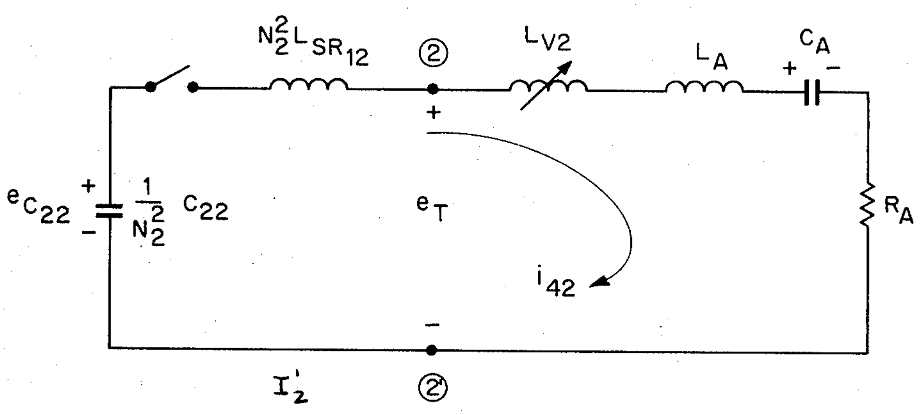
Figure 4:
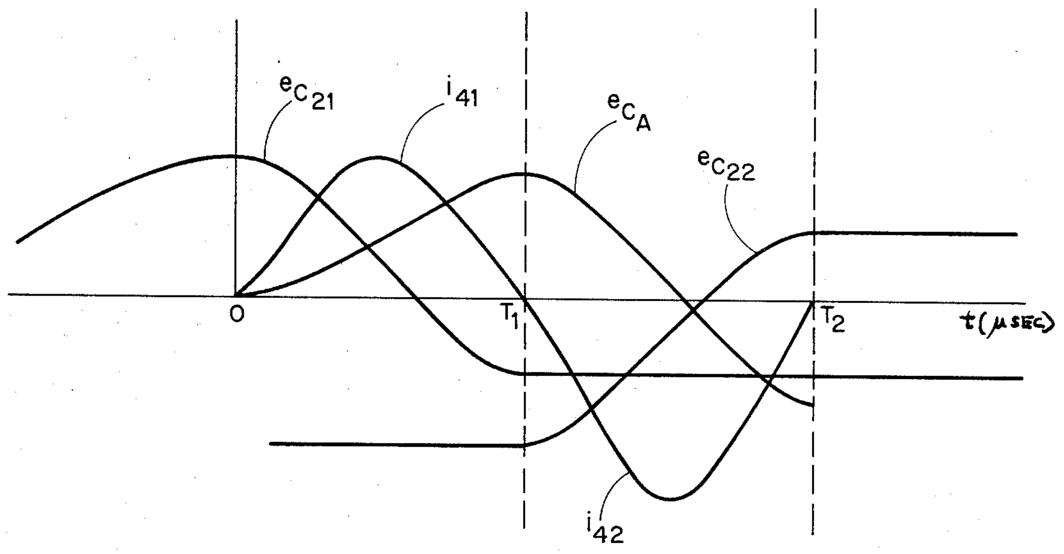
Figure 5A:
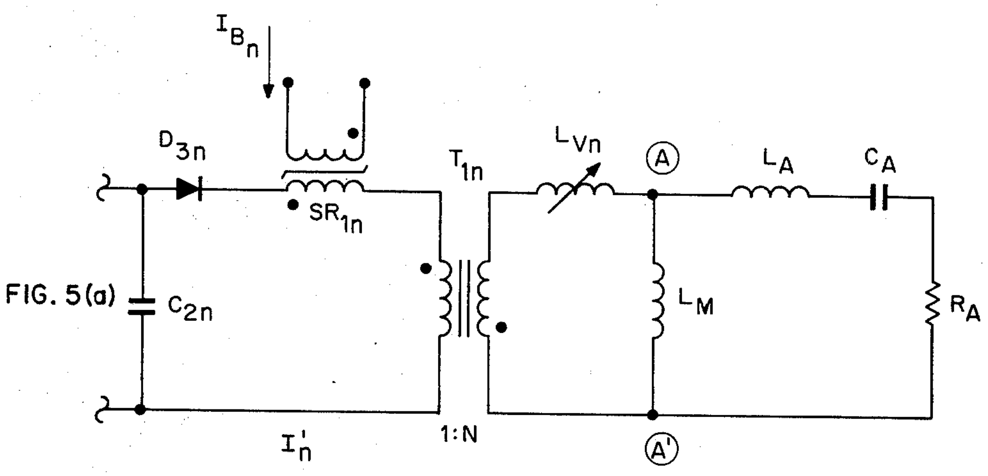
Figure 7:
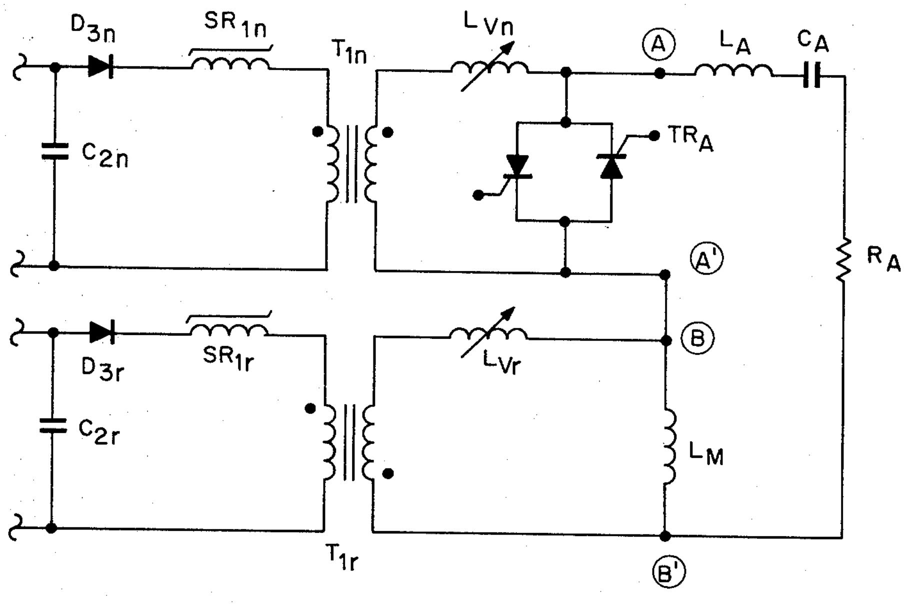
Figure 6:
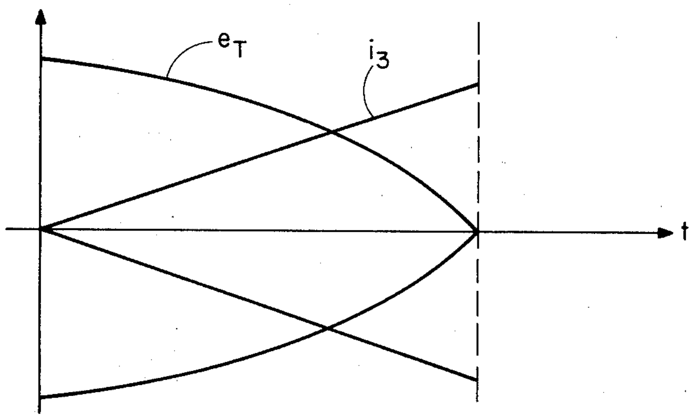
Figure 6:
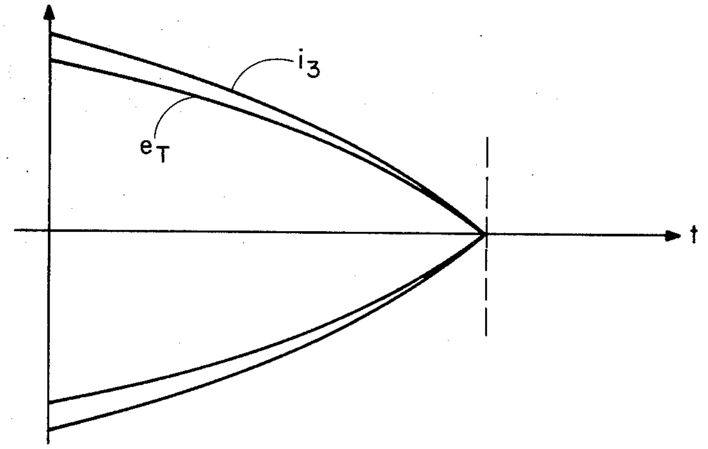
Figure 6:
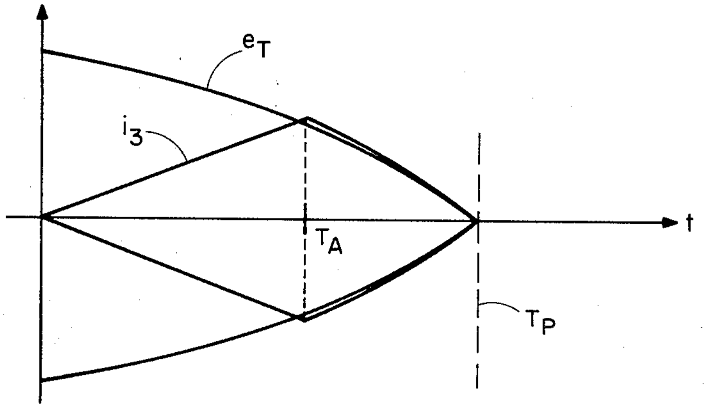

The invention will now be described with reference to the accompanying drawing,

FIG. 1 of which is a circuit diagram illustrating the invention in preferred form;

FIG. 2 is a wave-form diagram illustrating load current and trigger timing operation;

FIGS. 3 (*a*), 3(*b*) and 3(*c*) are respectively a circuit diagram of the preferred pulse compression circuit, an equivalent circuit diagram thereof, and a wave-form of the operation during the generation of the first half-cycle;

FIGS. 4 (*a*) and 4(*b*) are similar to FIGS. 3 (*b*) and 3(*c*), respectively, but for the generation of the second half-cycle;

FIGS. 5 (*a*) and 5(*b*) are fragmentary circuit and equivalent circuit diagrams of the operation by weak magnetic coupling of the resonant circuits involved;

FIGS. 6 (*a*) through 6(*c*) are envelope waveforms of the load terminal voltage and the transmitter current for the respective coupling conditions of series resonance coupling, weak magnetic couplings, and series resonance and magnetic coupling; and FIG. 7 is a circuit diagram of a modification employing series resonance and magnetic coupling.

When a tuned load is excited by a step of RF voltage at the same frequency as the tuned load, two current components are generated. One is an exponentially decaying component whose zero crossing occurs at times 0, $\pi/\omega$, 2 $\pi/\omega$, . . . , corresponding to those of a sine wave. The other component is a rising current whose RF phase is the same as the applied RF voltage. Initially, these two components combine and the distance between two consecutive zero crossings varies with time until the decaying exponential component has died out. In certain application, however, such as Loran-C and D navigation systems, it is desirable to have uniform spacing between the zero-crossings regardless of the phase of the excitation voltage. To compensate for this apparent phase modulation, however, it has been necessary to use special techniques such as rapidly changing the antenna tuning, or the switching in and out of reactive elements. Similar proposals are discussed, also, in my article "Automatic Tuning of High-Q Antenna For VLF FSK Transmission" appearing in the IEEE Transactions, Technical Group on Communications Systems, Vol CS-12, No. 1, March 1964, pp. 110–115. These techniques, however, are expensive and bulky. Since the magnetic pulse compression technique of the present invention provides independent control of each half-cycle of current, on the other hand, the width of each half-cycle can also be controlled independently, obviating these disadvantages. It is, therefore, another feature of the invention to provide such a simple and inexpensive apparatus for controlling the zero-crossings of the RF wave.

The magnetic pulse compression circuits I — I' through $I_n$ — $I_n'$ used with the tuned RF load $L_A$–$C_A$–$R_A$ of FIG. 1 are basically the same as those disclosed in my said copending application, modified, however, to provide independent amplitude adjustment through providing for each magnetic pulse compression circuit its own DC power supply, $E_1$ through $E_n$.

The SCR charging circuits at successive locations I . . . I*n* are shown similarly constructed, each provided with respective series input inductances $L_{11}$ and $L_{1n}$ and trigger-actuated SCRs, indicated at $SCR_{11}$ and $SCR_{1n}$, connected with the positive terminal + of the respective DC power supply sources $E_1$ and $E_n$. First energy storage charging circuits are provided by the elements $L_{11}$–$SCR_+$ AND $L_{1n}$–$SCR_{1n}$ in combination with respective capacitors $C_{11}$ and $C_{1n}$, each returned to the negative terminal - of the source $E_{dc}$. Second charging circuits are connected in cascade to follow the first charging circuits, comprising respective SCRs indicated at $SCR_{21}$ and $SCR_{2n}$, series inductances $L_{21}$ and $L_{2n}$, and capacitors $C_{21}$ and $C_{2n}$. Respective pulse compression reactors $SR_{11}$ and $SR_{1n}$ provided with respective diodes $D_{31}$ and $D_{3n}$ are connected to the second charging circuits of the circuits I . . . $I_n$, and feed the common RF storage tank load $L_A$–$C_A$–$R_A$ through respective output coupling transformers $T_{11}$ . . . $T_{1n}$, respectively associated with tuned output inductors $L_{v1} \ldots L_{vn}$.

In the circuit of FIG. 1, the two capacitors $C_{11}$ and $C_{21}$ of circuit I — I′, for example, are charged negatively by the corresponding power supply $E_1$. Other methods of charging these two capacitors also may be used, as, for example, the series method described in the copending application in which only capacitor $C_{11}$ is initially charged. In general, either or both of the two capacitors may be charged, the optimum charging method depending upon the particular application. When good pulse timing stability is required, the charge on both capacitors must, however, be controlled accurately.

By adjusting the voltage output of the power supply $E_1$, (as schematically indicated by the adjustment arrow in the power supply), the amount of charge on the capacitors may be varied, and thereby the magnitude of the output pulse. The two capacitors $C_{11}$ and $C_{21}$ are charged during the interval between the output RF pulses by means of a silicon controlled switching rectifier $SCR_{31}$. This switching rectifier $SCR_{31}$ (and its counterpart $SCR_{3n}$ in circuit $I_n$) is connected between the negative terminal — of supply $E_1$ (and counterpart $E_n$, etc.), and through series reactors $L_{41}$ and $L_{31}$ and diodes $D_{21}$ and $D_{11}$ (and counterparts $L_{4n}$ and $L_{3n}$ and their diodes $D_{2n}$ and $D_{1n}$) to the upper terminals of respective capacitors $C_{11}$ and $C_{21}$ (and counterparts $C_{1n}$ and $C_{2n}$, etc.). In particular, the type of RF pulses of concern in this example are of the form shown in FIG. 2(*a*), having a fast rise-time (for Loran-C applications, for example, from five to seven cycles of the RF) compared to the fall-time. In FIG. 2(*a*), the pulse rise-time is shown of the order of 2.5 cycles (100kHZ carrier frequency), with a fall-time of approximately 7.5 cycles. The sequential timing diagram illustrating the occurrence of the individual trigger signals to the SCRs is presented in FIG. 2(*b*). The delay caused by the magnetic pulse compression network I′ (or $I_n'$) is shown as $T_D$, with a particular value of $T_D$=15$\mu$ sec, in this illustration, corresponding to a pulse compression of 3. Thus, the trigger signals for, say, five pulse compression units, must occur 15 $\mu$sec. in advance in order to allow for the 15 $\mu$sec. delay in the pulse compression. It should be observed that the particular values above given are for the purpose of illustrating the invention only, and that other values of pulse compression and carrier frequency can equally well be chosen.

The sequence of operation is as follows. At some time in the interval between pulses, such as time $TR_{3n}$ in FIG. 2(*b*), capacitors $C_{1n}$ and $C_{2n}$ (where *n* represents any one of the pulse compression circuits) are charged negatively to the voltage $E_n$. Some time later, also in the interval between pulses, a trigger signal is applied to $SCR_{1n}$ and the voltage on $C_{1n}$ reverses polarity going from a state ① to a state ②. These states are so-labelled in FIG. 1 below capacitors $C_{1n}$ and $C_{2n}$ with the appropriate + and − charge polarities therefor illustrated vertically there-above. The voltages on capacitors $C_{1n}$ and $C_{2n}$ are now series-aiding and the application of a trigger signal to $SCR_{2n}$ at the time $T_{R2n}$ (FIG. 1) reverses the voltage on both capacitors $C_{1n}$ and $C_{2n}$, and the transition from state ② to state ③ takes place. Again, the polarities during state ③ are shown vertically there-above in FIG. 1. During this transition, the positive voltage on capacitor $C_{2n}$ drives the saturable reactor $SR_{1n}$ of the magnetic pulse compression network *In′*, which is biased into negative saturation by the bias current $I_{Bn}$, into positive saturation, which occurs at the time when the charge reversal is completed in state ③. The time it takes to drive the saturable reactor $SR_{1n}$ from negative to positive saturation is labelled $T_D$ in FIG. 2(*b*). Thus $T_D$ seconds after the application of trigger signal $TR_{2n}$, the saturable reactor saturates and the capacitor $C_{2n}$ discharges into the load through the matching transformer $T_{1n}$ and thus generates the *n*th half-cycle of the load current.

The detailed operation of the process of generating the load current is explained by means of FIGS. 3 and 4. FIG. 3 is concerned with the generation of the first half-cycle of the RF pulse. At time 0, the saturable inductor $SR_{11}$ saturates and, assuming an ideal matching transformer $T_{11}$, the circuit of FIG. 3(*a*) may be represented by the equivalent circuit of FIG. 3(*b*) for the purposes of demonstrating operation, with equivalent inductance $N_1^2 L_{SR_{11}}$ and capacitance $1/N_1^2\, C_{21}$, where $N_1$ is the turns ratio of $T_{11}$. Thus the last stage of the pulse compression circuit and the tuned load forms a series resonant circuit whose natural frequency of oscillation depends upon the inductance of $SR_{11}$, $L_{v1}$, the load inductance and capacitance $L_A$ and $C_A$, and the value of $C_{21}$. The value of that resonant frequency may be adjusted by means of the variable inductor $L_{v1}$. The voltage and current waveforms during the generation of the load current are shown in FIG. 3(*c*). Because it is the first half-cycle of the RF pulse, the charge on the load capacitor $C_A$ is zero, and the voltage $e_{oA}$ (FIG. 3(*c*)) on capacitor $C_A$ increases from zero to some final value depending upon the circuit parameters. Since the voltage on capacitor $C_{21}$ must reverse polarity to provide the blocking voltage for the diode $D_{31}$, the capacitance $(1/N_1^2)\, C_{21}$ of the equivalent circuit of FIG. 3 (*b*) must be less than $C_A$. The exact value of $C_{21}$ is thus determined by the required diode blocking voltage which, in turn, must be equal to or greater than the terminal voltage $e_T$ that exists during the generation of the RF pulse. The terminal voltage $e_T$ is applied across the opposite polarity SCR switching network $SCR_{A1}$–$SCR_{A2}$–$R_D$ to the load $L_A$–$C_A$–$R_A$.

Following the generation of the first half-cycle of current, the voltage on capacitor $C_{21}$ remains at its minimum blocking value until a trigger signal $TR_{31}$ is applied to $SCR_{31}$, which further increases the blocking voltage by charging capacitor $C_{21}$ negatively to the power supply value $E_1$.

The generation of the second half-cycle of current (in the next similar circuit of the sequential inverter-pulse compression system $I_2$ — $I_2'$, not shown in FIG. 1) is shown in FIG. 4. At time $T_1$ (FIG. 4(*b*)), the voltages on capacitors $C_{22}$ and $C_A$ of the system $I_2$ — $I_2'$, are series-aiding and the saturable inductor $SR_{12}$ saturates. The halfgcycle of current labelled $i_{42}$ is thus generated as shown in FIG. 4(*b*). The only differences between the generation of the first and second half-cycles of current are that the polarity of the capacitor voltage $e_{c_{22}}$ is reversed, and initial charge exists on the capacitor $C_A$. The presence of charge on $C_A$ is important in that it aids in generating the reverse blocking voltage on $C_{22}$. Detailed circuit analysis shows that the capacitor $C_{22}$ can be increased and be made equal in value to or greater than $C_A$. Again, the criterion is that the reverse voltage must be equal to or greater than the terminal voltage $e_T$ that exists during the generation of the pulse.

During the generation of the front part of the pulse, the charge on $C_A$ increases and the required value of the reflected capacitance, $(1/N^2_n)\ C_{2n}$, increases. The value of this capacitance may be adjusted by either adjusting the turns-ratio $N_n$ of the coupling transformer $T_{1n}$ or the capacitance $C_{2n}$. Because of the independent generation of each half-cycle of current, optimum match can be obtained during the transient buildup.

When the peak of the pulse is reached, no more energy is required of the RF generator and the two switching SCRs, $SCR_{A1}$ and $SCR_{A2}$ (FIG. 1) shunting the matching transformers, are turned on and the tank circuit $L_A$–$C_A$–$R_A$ rings down through the damping resistor $R_D$. The triggering signal for these SCRs is indicated in timed relation at $TR_A$ in FIG. 2(*b*).

In the Loran-C navigation system before-mentioned and other systems, a change of 180° in the carrier phase (phase coding) is required. This phase reversal may be obtained by starting the generation of the pulse with a second magnetic compression circuit and adding a further circuit to maintain the same peak power. A slight change in envelope shape will result, but for a given phase code, the average shape over the pulse group remains constant and can be adjusted to any desired shape. To compensate for phase modulation resulting from envelope timing adjustment, the second pulse compression circuit can be constructed to generate a pulse adjustable in width from 2.5 μsec. to 7.5 μsec., which is the required envelope timing adjustment for Loran-C. The second half-cycle of current is selected for this adjustment to permit phase coding.

Figure 5B:
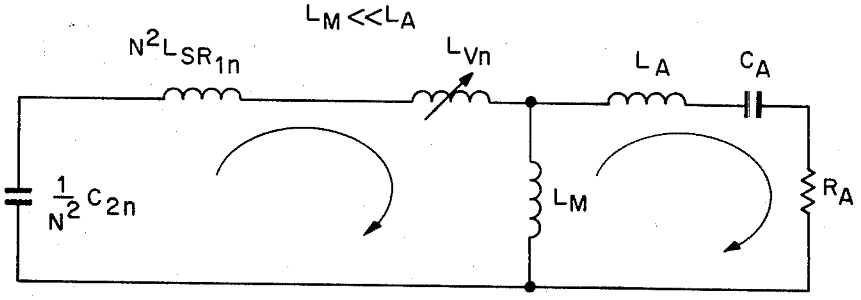

The series method of coupling the magnetic pulse compression networks to the tuned load described above has a disadvantage in some cases; namely, that the reactive power stored in the resonant circuit is coupled into the pulse compression circuit. At high power levels (near the peak of the RF pulse), this coupling may give rise to high power dissipation and volt-ampere ratings of the pulse circuits. This disadvantage may be eliminated by using a combination of series resonance and weak magnetic coupling. Weak magnetic coupling of the pulse compression circuits to the resonant load is shown in FIG. 5(*a*), with only one pulse compression circuit $I_n'$ illustrated for purposes of simplicity. Any desired number of pulse compression circuits can, however, be connected to terminals Ⓐ and Ⓐ of FIG. 5(*a*), the equivalent circuit of which is shown in FIG. 5(b); namely, a weak magnetic coupling of two resonant circuits.

In FIG. 6, the series resonance and weak magnetic coupling methods, with typical values of the RF envelopes of the terminal voltage $e_T$ and the pulse compression circuit current $i_3$ are compared. For the same load current, the terminal voltage is identical for the two cases. For series resonance coupling, FIG. 6(*a*), the pulse compression current $i_3$ is the same (except for the output transformer transformation) as the load current, starting at a low value and building up to a high value at the peak of the pulse. It should be noted that the product of $(e_T)_{max}$ and $(i_3)_{max}$ is the peak volt-ampere rating of the RF power source.

For weak magnetic coupling, on the other hand, the pulse compression current $i_3$ starts at a high value, FIG. 6(*b*), and then decreases to zero at approximately the peak of the load current. By combining these two methods of coupling, FIG. 6(*c*), the minimum volt-ampere rating of the pulse-compression networks is obtained. This optimum coupling may be effected with the circuit modification of FIG. 7. It is to be noted than *n* pulse compression circuits may be connected to terminals Ⓐ, Ⓐ, and r circuits to terminals Ⓑ, Ⓑ. The optimum switchover time occurs when the current $i_3$ for the two coupling methods are equal, shown as time $T_A$ in FIG. 6(*c*). At time $T_A$, trigger signals are applied to the SCR switch connected across terminals Ⓐ, Ⓐ, shorting out and thus effectively removing the series connection. Thus, from time 0 to $T_A$, the series connection is used; and from $T_A$ to $T_p$, the weak magnetic connection is used. It should be observed, also, that either of these coupling methods may be used alone. When only the weak magnetic coupling method of FIG. 5 is used, the output SCR switch may indeed be eliminated. To obtain optimum match, a different turns-ratio may be used for each output transformer ($T_{1n}$ in FIG. 5). Another method of obtaining optimum match, moreover, is to use a different value of mutual coupling inductance $L_M$ for each pulse generator, or a combination of these two methods.

Further modification will also occur to those skilled in this art and all such are considered to fall within the spirit and scope of the invention as defined in the appended claims.

What is claimed is:

1. Radio-frequency pulse generation apparatus having, in combination, a plurality of sequentially operated energy storage and discharge and magnetic pulse compression circuits for generating successive fast-rising pulses, a common tuned load the impedance of which varies with the current amplitude during the generation of said pulses, a plurality of coupling transformer circuits, one corresponding to each of the pulse compression circuits and connecting the same to said common tuned load, the pulse compression circuits being provided with respective switching means for sequentially discharging the stored energy producing pulse compression and transmitting the same through the corresponding coupling transformer circuits into the tuned load.

2. Apparatus as claimed in claim 1 and in which the said coupling circuits each include a series-resonance network.

3. Apparatus as claimed in claim 1 and in which the said coupling circuits each include a weak magnetic coupling.

4. Apparatus as claimed in claim 1 and in which the said coupling circuits each include both a series-resonance network and a weak magnetic coupling, and further switching means is provided to remove the series-resonance network from effective operation when the current in the generated pulses reaches a value of substantial equality for each of the series-resonance and weak magnetic couplings.

5. Apparatus as claimed in claim 1 and in which each energy storage circuit is provided with its own source of DC supply voltage.

6. Apparatus as claimed in claim 1 and in which each energy storage and discharge circuit comprises a pair of cascaded charging circuits each having series inductances and SCR switches and parallel capacitors, and each corresponding magnetic pulse compression network comprises saturable reactor means series-connected between the charging circuits and their corresponding coupling transformer circuit.

7. Apparatus as claimed in claim 6 and in which means is provided, responsive to the triggering of said SCR switches, for saturating the corresponding saturable reactor means and thereupon discharging the energy charged in said charging circuits into the tuned load through the corresponding coupling transformer circuits.

8. Apparatus as claimed in claim 1 and in which further switching means is provided shunting the coupling transformer circuits and operable when the peaks of the said pulses are sequentially reached to cause the tuned load thereupon to ring down.

9. A method of radio-frequency pulse generation, that comprises, storing energy at a plurality of locations and sequentially discharging the same, magnetically compressing each such discharge to generate corresponding sequential compressed output pulses, coupling said output pulses to a tuned load, and shunting out said coupling when the peaks of said output pulses are sequentially reached, thereby causing the tuned load thereupon to ring down.

10. A method as claimed in claim 9 and in which said coupling is series resonated for relatively low output pulse currents and weakly coupled for relatively high output pulse currents.

* * * * *